United States Patent
Ryu et al.

(10) Patent No.: US 9,276,192 B2
(45) Date of Patent: Mar. 1, 2016

(54) MAGNETOELECTRIC COMPOSITES

(71) Applicant: KOREA INSTITUTE OF MACHINERY AND MATERIALS, Daejeon (KR)

(72) Inventors: Jungho Ryu, Changwon (KR); Jong-Woo Kim, Changwon (KR); Woon-Ha Yoon, Changwon (KR); Dong-Soo Park, Changwon (KR)

(73) Assignee: KOREA INSTITUTE OF MACHINERY AND MATERIALS, Daejeon (KR)

( * ) Notice: Subject to any disclaimer, the term of this patent is extended or adjusted under 35 U.S.C. 154(b) by 8 days.

(21) Appl. No.: 13/848,145

(22) Filed: Mar. 21, 2013

(65) Prior Publication Data

US 2013/0252030 A1 Sep. 26, 2013

(30) Foreign Application Priority Data

Mar. 22, 2012 (KR) .................. 10-2012-0029244

(51) Int. Cl.
*H01L 41/12* (2006.01)
*H01L 41/16* (2006.01)

(52) U.S. Cl.
CPC .............. *H01L 41/12* (2013.01); *H01L 41/16* (2013.01); *Y10T 156/10* (2015.01); *Y10T 428/2495* (2015.01); *Y10T 428/31678* (2015.04)

(58) Field of Classification Search
None
See application file for complete search history.

(56) References Cited

U.S. PATENT DOCUMENTS

| | | | |
|---|---|---|---|
| 6,465,937 B1* | 10/2002 | Chen et al. .................... | 310/360 |
| 6,747,317 B2* | 6/2004 | Kondo et al. .................. | 257/347 |
| 7,368,172 B2* | 5/2008 | Kondo et al. .................. | 428/446 |
| 7,888,848 B2* | 2/2011 | Matsushita .................... | 310/358 |
| 7,908,722 B2* | 3/2011 | Han ............................. | 29/25.35 |
| 8,604,676 B1* | 12/2013 | Finkel et al. ................... | 310/358 |
| 2002/0036282 A1* | 3/2002 | Chiang et al. ............. | 252/62.9 R |
| 2008/0203855 A1* | 8/2008 | Viehland et al. ............... | 310/357 |
| 2008/0265718 A1* | 10/2008 | Sakashita et al. ............. | 310/358 |
| 2008/0309198 A1* | 12/2008 | Van Tol et al. ................. | 310/333 |
| 2010/0001619 A1* | 1/2010 | Yuuya et al. ................... | 310/334 |
| 2012/0043857 A1* | 2/2012 | Ueda et al. .................... | 310/330 |
| 2014/0042574 A1* | 2/2014 | Carman et al. ................ | 257/421 |

OTHER PUBLICATIONS

Effect of the Magnetostrictive Layer on Magnetoelectric Properties in Lead Zirconate Titanate/Terfenol-D Laminate Composites, Jungho Ryu, Shashank Priya, Kenji Uchino, and Hyoun-Ee Kim, Journal of the American Ceramic Society vol. 84, No. 12, pp. 2905-2908 (2001).
Giant magnetoelectric effect of a hybrid of magnetostrictive and piezoelectric composites, J. G. Wan, J.-M. Liu, H. L. W. Chand et al. Journal of Applied Physics, vol. 93, No. 12, pp. 9916-9919 (2003).

* cited by examiner

*Primary Examiner* — Kevin Bernatz
(74) *Attorney, Agent, or Firm* — Maxon Law Group; Justin H. Kim

(57) ABSTRACT

Disclosed is a magnetoelectric (ME) composite including both a piezoelectric material and a magnetostrictive material, wherein a piezoelectric single crystal material having high piezoelectric properties is used as the piezoelectric material, and a metal magnetostrictive material having high magnetostrictive properties is used as the magnetostrictive material, thus achieving an ME composite having a layered structure via adhesion. When the ME layered composite is manufactured such that a <011> crystal orientation of the piezoelectric single crystal material is set to a thickness direction, high ME voltage coefficient, which is at least doubled, compared to a conventional <001> crystal orientation, can be obtained, and such an effect is further maximized in the resonance of the composite.

21 Claims, 16 Drawing Sheets

Ni or Co/PZT

By Newnham et al. (1990), Nan et al. (2000)

$\alpha_{ME}$ : ~100mV/cm-Oe

US 9,276,192 B2

MAGNETOELECTRIC COMPOSITES

This application claims priority under 35 USC 119 to Korean Patent application No. 10-2012-0029244 filed Mar. 22, 2012, the disclosure of which is incorporated herein by reference.

BACKGROUND OF THE INVENTION

1. Field of the Invention

The present invention relates to a magnetoelectric composite and, more particularly, to a layered composite in which the orientation of a piezoelectric material layer is controlled such that a <011> orientation is set to a thickness direction.

2. Description of the Related Art

A magnetoelectric (ME) effect is a material property and is widely found in composite structures comprising magnetostrictive and piezoelectric materials.

The ME effect means that, when any material having properties in response to both a magnetic field and an electric field is exposed to a magnetic field, an electric voltage is generated, whereas when the material is exposed to an electric field, it is magnetized. Thus, in order to impart an ME effect to a material, the material should essentially have both ferromagnetic, ferrimagnetic, or antiferromagnetic properties in response to an external magnetic field, and ferroelectric, ferroelectric or antiferroelectric properties in response to an external electric field.

In order to successfully commercialize magnetic-electric sensors, magnetic sensors, electric sensors, photoelectronic devices, microwave electronic devices, magnetic-electric or electric-magnetic transducers, etc., which are recently studied, development and research into materials having both ferromagnetic and ferroelectric properties at room temperature and having ME effects at room temperature or higher corresponding to the actual usage temperature of devices is ongoing.

A typical example of a material having both ferromagnetic and ferroelectric properties at room temperature is bismuth manganate ($BiMnO_3$). However, the ferromagnetic phase transition temperature and the ferroelectric phase transition temperature (Tc) of bismuth manganate are about 100K and 450K, respectively, and this material has both ferromagnetic and ferroelectric properties only at 100K or more (N. A. Hill, K. M. Rabe, Physical Review B vol 59 pp 8759 (1999)). When a predetermined material has both ferromagnetic and ferroelectric properties only in such a very low temperature range, it cannot be applied to a variety of devices useful at room temperature, making it impossible to achieve commercialization. On the other hand, yttrium manganate ($YMnO_3$), which has antiferromagnetic and ferroelectric properties, has been developed as a material similar to bismuth manganate, but the antiferromagnetic phase transition temperature and the ferroelectric phase transition temperature of yttrium manganate are 70~130K and 570~990K, respectively, and this material has both antiferromagnetic and ferroelectric properties only at a temperature equal to or lower than 70~130K, making it impossible to achieve commercialization, as in condensers using bismuth manganate (A. Filippetti, N. A. Hill, Journal of Magnetism and Magnetic Materials vol 236 pp 176 (2001)). On the other hand, in the case of a condenser composed of $Bi_4Ti_3O_{12}$ having a layered perovskite structure, only ferroelectric properties are exhibited at room temperature, and ferromagnetic properties are not, and thus it cannot be applied to devices requiring both ferromagnetic and ferroelectric properties.

Since the 1890s, many attempts have been made to develop homogeneous materials having magnetoelectric effects, and thereby homogeneous materials such as $Cr_2O_3$, $Pb(Fe_{1/2}Nb_{1/2})O_3$, $BaMeO_4$ (Me=Mn, Fe, Co, Ni), $Cr_2BeO_4$, $BiFeO_3$, etc., have been found to have magnetoelectric effects (G. Smolenskii and V. A. Ioffe, Colloque International du Magnetisme, Communication No 711958; G. A. Smolenskii and I. E. Chupis, Problems in Solid State Physics (Mir Publishers, Moscow, 1984; I. H. Ismailzade, V. I. Nesternko, F. A. Mirishli, and P. G. Rustamov, Phys. Status Solidi 57 99 (1980)). However, such materials are inappropriate for use in actual devices because the magnetoelectric coefficient is very low to the level of 0.001~0.02 volt/cm·Oe and the temperatures at which magnetoelectric effects are shown are mostly as low as 0° C. or less.

In order to increase the very low magnetoelectric coefficient of single-phase materials as mentioned above, research has been conducted on developing composite materials having high magnetoelectric coefficients at room temperature or higher by mixing a material in response to a magnetic field with a material in response to an electric field. A typical composite material, which exhibits an magnetoelectric effect at room temperature or higher, is exemplified by Terfenol-D (a magnetostrictive metal in response to a magnetic field)/PZT (a ferroelectric oxide in response to an electric field)/Terfenol-D.

The Terfenol-D/PZT/Terfenol-D composite material is very unfavorable in terms of price because Terfenol-D is an expensive rare earth metal compound, and the magnetoelectric effect of the Terfenol-D/PZT/Terfenol-D composite material may considerably vary depending on the adhesion properties.

Also, the maximum magnetoelectric coefficient of the Terfenol-D/PZT/Terfenol-D composite material is about 10 volt/cm·Oe, which is higher than the magnetoelectric coefficients of single-phase magnetoelectric materials developed to date, but has to be further increased so that such a composite material can be applied to actual devices (J. G. Wan, J.-M. Liu, H. L. W. Chand et al. Journal of Applied Physics, Vol 93, No 12, pp 9916~9919 (2003); Jungho Ryu, Shashank Priya, Kenji Uchino, and Hyoun-Ee Kim, Journal of the American Ceramic Society Vol 84, No 12, pp 2905~2908 (2001)).

FIG. 1 illustrates a voltage generation principle of a conventional ME (MagnetoEletric) particulate composite, FIG. 2 illustrates the maximum magnetoelectric coefficient ($\alpha_{ME}$) and the structure of the conventional ME particulate composite, FIG. 3 illustrates a voltage generation principle of an ME layered composite, and FIG. 4 illustrates the Terfenol-D/PZT/Terfenol-D composite. The layered composite of FIG. 4 is configured such that the piezoelectric material whose orientation is not taken into consideration because of the use of the piezoelectric ceramic PZT is layered with the metal magnetostrictive material Terfenol-D.

As illustrated in FIGS. 1 to 4, when a magnetic field is applied, the magnetostrictive material is deformed, and voltage is generated from the piezoelectric material due to generation of stress resulting from such deformation. As mentioned above, in the case of the Ni or Co-ferrite/PZT particulate composite, the maximum magnetoelectric coefficient ($\alpha_{ME}$) is about 100 mV/cm·Oe. The layered composite such as Terfenol-D/PZT/Terfenol-D has a maximum magnetoelectric coefficient ($\alpha_{ME}$) of about 10 volt/cm·Oe, which is increased by about 100 times compared to that of the ME particulate composite, not enough to apply it to actual devices.

SUMMARY OF THE INVENTION

Research into magnetoelectric (ME) composites, which are expected to be applied to spintronic devices, high-sensitivity magnetic sensors, and vibration-magnetic composite energy harvesters, is actively carried out all over the world, and ME composites having a variety of structures are being proposed in order to achieve high ME composites.

Materials applicable to such ME composites have been very thoroughly studied over the past ten years, and a composite having a magnetostrictive-piezoelectric-magnetostrictive layered structure is favorable in attaining high ME composites.

Also, it is important that a material having piezoelectric properties that are as high as possible and a material having a high magnetostrictive coefficient are adopted so as to ensure strong coupling between these two materials.

However, even when ME layered composites are formed using such a giant magnetostrictive material, the maximum magnetoelectric coefficient is conventionally low and thus has to be increased so that they can be applied to actual devices, and thus limitations are imposed on actualizing them. Therefore, the present invention is intended to provide an ME composite which is configured such that piezoelectric single crystals having high piezoelectric properties and a metal magnetostrictive material having a high magnetostrictive coefficient are provided in the form of a layered structure, wherein the orientation of the piezoelectric single crystals is controlled so as to further increase the sensitivity of the ME composite.

Accordingly, the present invention provides an ME composite, which includes at least one piezoelectric material layer composed of a piezoelectric material and at least one magnetostrictive material layer composed of a magnetostrictive material, which are stacked, wherein the piezoelectric material layer is configured such that <011> oriented single crystals are stacked in a thickness direction.

Also, according to the present invention, the crystal structure of the single crystals may be a perovskite structure.

Also, according to the present invention, the single crystals may be a solid solution comprising $xPb(A1, A2, \ldots, B1, B2, \ldots)O_3+(1-x)PbTiO_3$ (wherein x is a molar fraction, $0<x<1$), in which A1, A2, . . . are any one or a plurality of elements selected from the group consisting of Zn, Mg, Ni, Lu, In and Sc, and B1, B2, . . . are any one or a plurality of elements selected from the group consisting of Nb, Ta, Mo and W.

Also, according to the present invention, the single crystals may be any one selected from among $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), and $BaTiO_3$.

Also, according to the present invention, the magnetostrictive material may be any one selected from among ferrite-based ceramics, Ni, Terfenol-D, Metglas, and Gafenol.

Also, according to the present invention, the magnetostrictive material layer and the piezoelectric material layer may be alternately stacked.

Also, according to the present invention, the frequency of the alternating magnetic field applied to the magnetostrictive material layer may be adjusted, so that a resonance frequency of the piezoelectric material layer becomes variable.

Also, according to the present invention, the thickness ratio of the piezoelectric material layer and the magnetostrictive material layer may be 0.4~2.

An embodiment of the present invention provides an ME composite, which includes a first magnetostrictive material layer composed of a magnetostrictive material; a piezoelectric material layer composed of a piezoelectric material; and a second magnetostrictive material layer composed of a magnetostrictive material, wherein the piezoelectric material layer is configured such that <011> oriented single crystals are stacked in a thickness direction.

Also, according to the present invention, the crystal structure of the single crystals may be a perovskite structure.

Also, according to the present invention, the single crystals may be a solid solution comprising $xPb(A1, A2, \ldots, B1, B2, \ldots)O_3+(1-x)PbTiO_3$ (wherein x is a molar fraction, $0<x<1$), in which A1, A2, . . . are any one or a plurality of elements selected from the group consisting of Zn, Mg, Ni, Lu, In and Sc, and B1, B2, . . . are any one or a plurality of elements selected from the group consisting of Nb, Ta, Mo and W.

Also, according to the present invention, the single crystals may be any one selected from among $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), and $BaTiO_3$.

Also, according to the present invention, the magnetostrictive material may be any one selected from among ferrite-based ceramics, Ni, Terfenol-D, Metglas, and Gafenol.

Also, according to the present invention, the thickness ratio of the piezoelectric material layer and the first or second magnetostrictive material layer may be 0.4~2.

Also, according to the present invention, the ratio between thickness, width and length of the ME composite may be adjusted, so that the resonance-antiresonance frequency range of the composite becomes variable.

In addition, the present invention provides an electronic device, which includes an ME composite having an ME effect and comprising at least one piezoelectric material layer composed of a piezoelectric material and at least one magnetostrictive material layer composed of a magnetostrictive material, which are stacked and in which the piezoelectric material layer is configured such that <011> oriented single crystals are stacked in a thickness direction.

Also, according to the present invention, the electronic device may be any one selected from among a spintronic device, an ultrahigh-speed information storage device, a magnetic-electric sensor, a magnetic sensor, an electric sensor, an optoelectronic device, a microwave electronic device, a magnetic-electric transducer, an electric-magnetic transducer, a magnetic driving energy harvester, and a magnetic-mechanical composite energy harvester.

Also, according to the present invention, the electronic device may utilize the ME effect.

Also, according to the present invention, when utilizing the maximum ME properties of the ME composite at the antiresonance frequency depending on the frequency of the alternating magnetic field, the ratio between thickness, width and length of the ME composite may be adjusted, so that the resonance-antiresonance frequency range of the composite may be controlled, thereby making it possible to manufacture a device having maximum ME properties at a specific frequency.

In addition, the present invention provides a method of manufacturing the ME composite, which includes preparing at least one piezoelectric material layer composed of a piezoelectric material and at least one magnetostrictive material layer composed of a magnetostrictive material; and alternately stacking the piezoelectric material layer and the magnetostrictive material layer, wherein the piezoelectric material layer is configured such that <011> oriented single crystals are stacked in a thickness direction.

Also, according to the present invention, the method may further include applying a conductive epoxy adhesive onto a surface for bonding the piezoelectric material layer and the magnetostrictive material layer to each other, after preparing.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Figure 1:
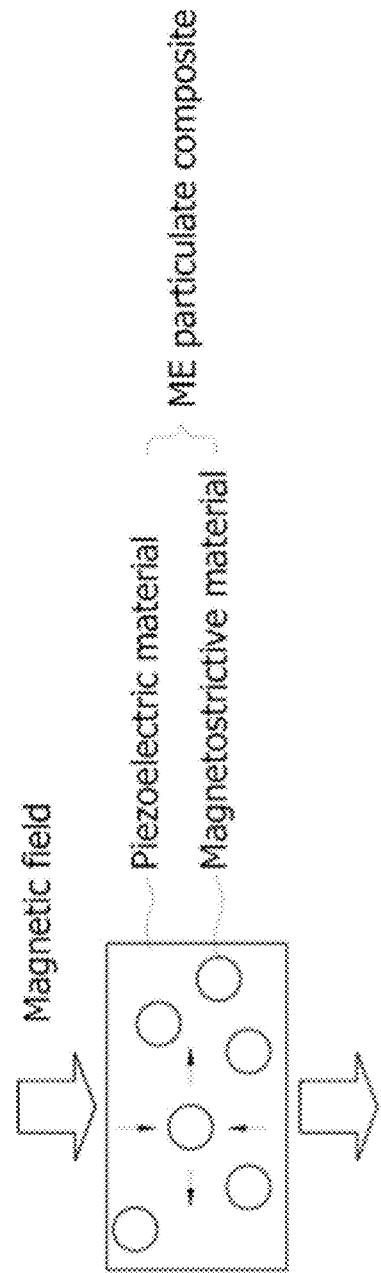
FIG. 1 illustrates a voltage generation principle of a conventional ME (MagnetoElectric) particulate composite.
Figure 2:
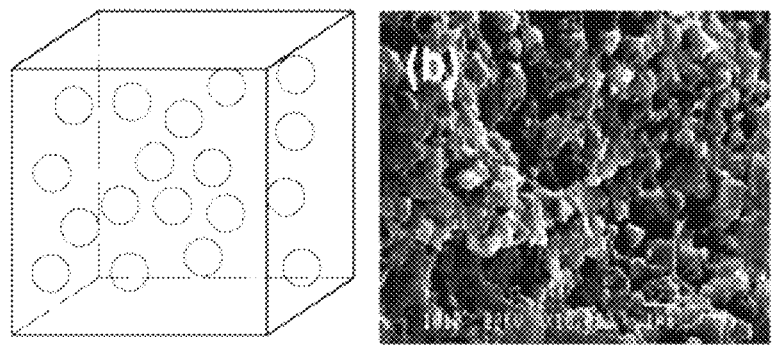
FIG. 2 illustrates a maximum ME coefficient ($\alpha_{ME}$) and a structure of the conventional ME particulate composite.
Figure 3:
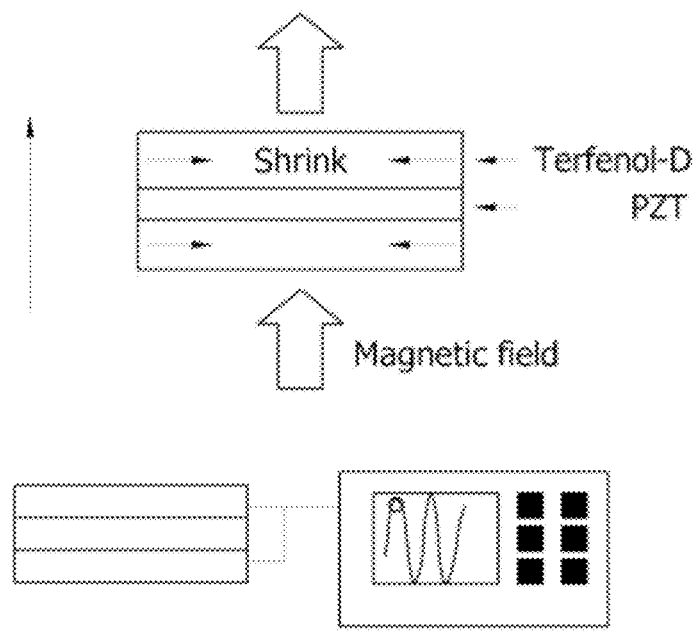
FIG. 3 illustrates a voltage generation principle of an ME layered composite.
Figure 4:
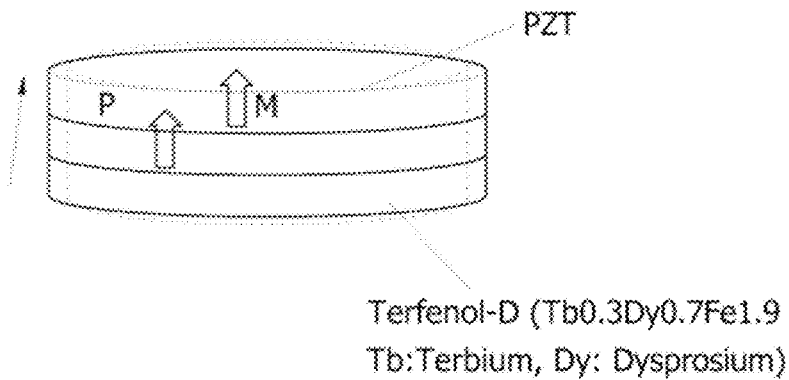
FIG. 4 illustrates a basic structure of a Terfenol-D/PZT/Terfenol-D layered composite.

Hereinafter, embodiments of the present invention will be more fully understood with reference to the appended drawings. Throughout the drawings, the same reference numerals are used to refer to the same or similar elements. Furthermore, descriptions of known techniques, even if they are pertinent to the present invention, are regarded as unnecessary and may be omitted when they would make the characteristics of the invention and the description unclear.

Figure 5:
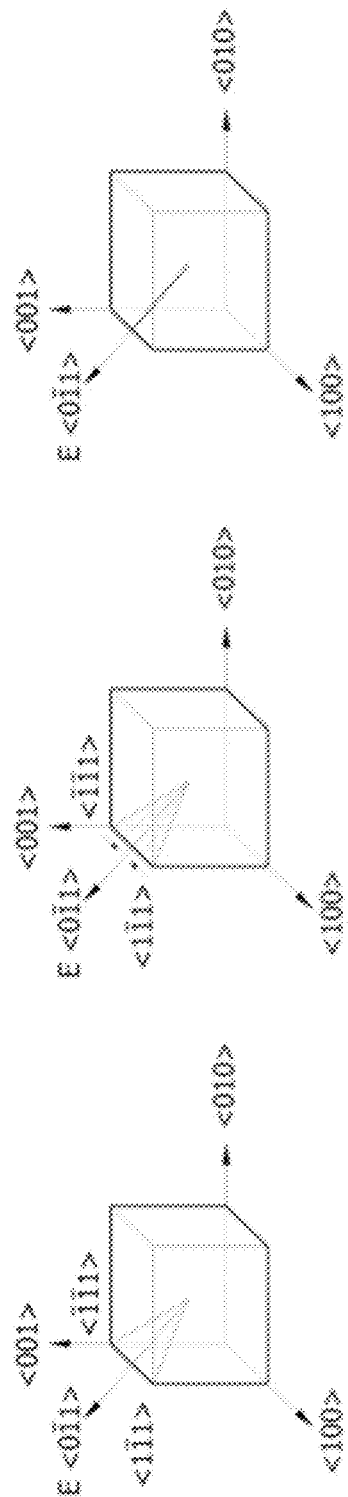
FIG. 5 illustrates the orientation of piezoelectric single crystals according to the present invention.

FIG. 5 illustrates the orientation of piezoelectric single crystals according to the present invention.

A conventional ME composite using piezoelectric single crystals is configured such that, upon layering a magnetostrictive material and a piezoelectric material using an <001> orientation of piezoelectric single crystals, a layered structure in which the <001> orientation is set to a thickness direction of the piezoelectric material is employed, and such an orientation structure uses the piezoelectric constant $g_{31}$ of the piezoelectric material.

As illustrated in FIG. 5, the piezoelectric single crystals according to the present invention are stacked such that the <011> orientation is set to the thickness direction of the piezoelectric material upon layering the magnetostrictive material and the piezoelectric material. A <001> oriented piezoelectric single crystal has one polarization direction, but a <011> oriented single crystal has two polarization directions and may use superior transverse piezoelectric properties, that is, higher piezoelectric constants $g_{31}$ and $g_{32}$, compared to the <001> oriented piezoelectric single crystal.

Using such effects in the present invention, high ME properties may be achieved only through the orientation of the single crystals without the need for an expensive giant magnetostrictive material such as Terfenol-D.

The high transverse piezoelectric properties of the <011> oriented piezoelectric single crystals may be shown in the following Table 1 wherein the piezoelectric constant $g_{31}$ in the <110> orientation corresponding to the <011> orientation is higher than the piezoelectric constant in the <001> orientation by about three times.

TABLE 1

| | Polycrystalline PZT-based ceramic | <001> oriented PMN-PT single crystal | <110> oriented PMN-PT single crystal |
|---|---|---|---|
| Piezoelectric constant $d_{33}$ (pC/N) | 430 | 1150 | 560 |
| Piezoelectric constant $d_{31}$ (pC/N) | 210 | 594 | 972 |
| Capacitance (nF) | 12.5 | 26 | 17 |
| Piezoelectric voltage constant $g_{31}$ (mVm/N) | 11.3 | 15.7 | 39.5 |
| Dielectric constant $K_{33}$ | 2100 | 4272 | 2798 |
| Electromechanical coupling factor, $k_{31}$ | 0.34 | 0.42 | 0.78 |

Figure 6:
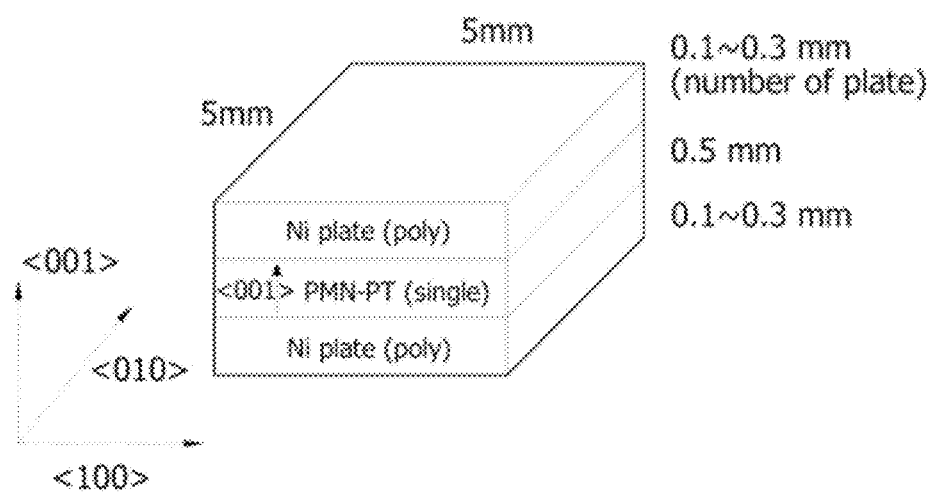
FIG. 6 illustrates a conventional ME layered composite used as a comparative example of the present invention.

FIG. 6 illustrates a conventional ME layered composite, used as a comparative example of the present invention.

As illustrated in FIG. 6, a Ni plate is used as the magnetostrictive material, and $Pb(Mg_{1/3}Nb_{2/3})O_3$—$PbTiO_3$ (PMN-PT) is used as the piezoelectric single crystal material, wherein piezoelectric single crystals are oriented in <001> corresponding to a thickness direction of layers.

Figure 7:
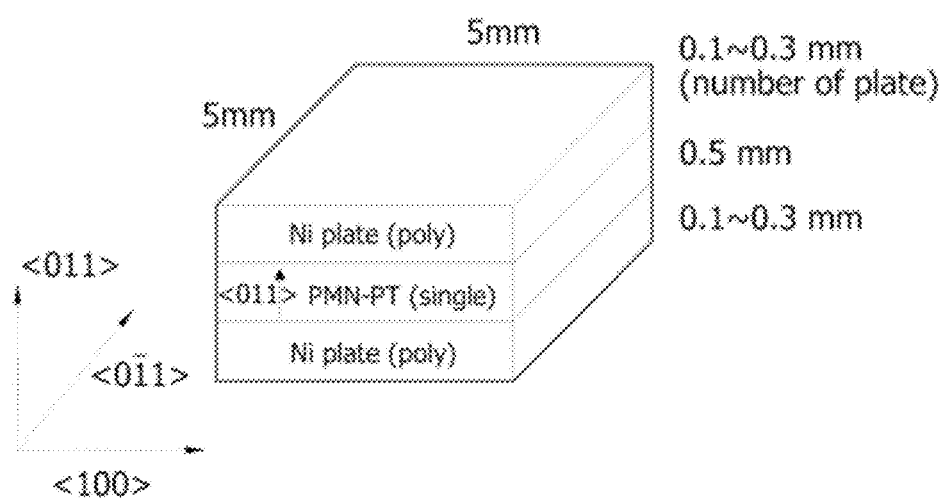
FIG. 7 illustrates a ME layered composite according to an embodiment of the present invention.

FIG. 7 illustrates an ME layered composite according to an embodiment of the present invention.

As illustrated in FIG. 7, a Ni plate is used as the magnetostrictive material, and $Pb(Mg_{1/3}Nb_{2/3})O_3$—$PbTiO_3$ (PMN-PT) is used as the piezoelectric single crystal material, wherein piezoelectric single crystals are oriented in <011> corresponding to a thickness direction of layers.

Figure 8:
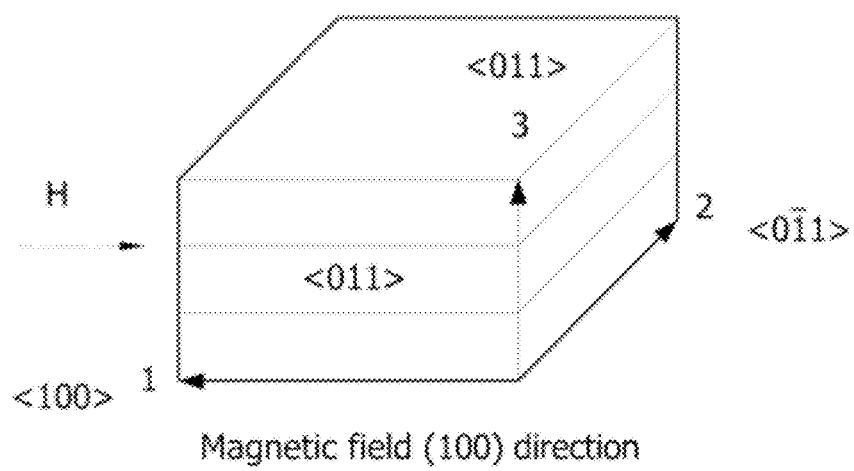
FIG. 8 illustrates a magnetic field application direction of the ME layered composite according to the present invention.
Figure 8:
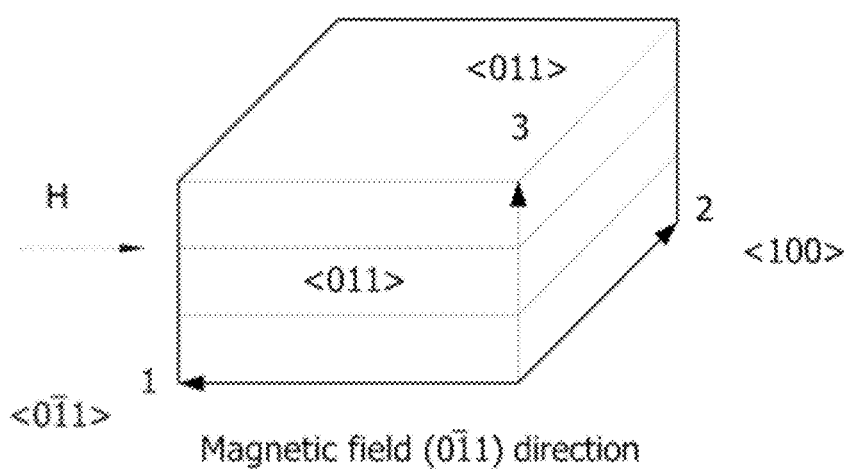

FIG. 8 illustrates the magnetic field application direction of the ME layered composite according to the present invention.

As illustrated in FIG. 8, the piezoelectric single crystals used in the present invention are anisotropic, and have ME properties varying depending on the orientation. Hence, while the magnetic field application direction is changed to a <100> direction and a <0$\bar{1}$1> direction, the properties of the piezoelectric single crystals are measured.

Figure 9:
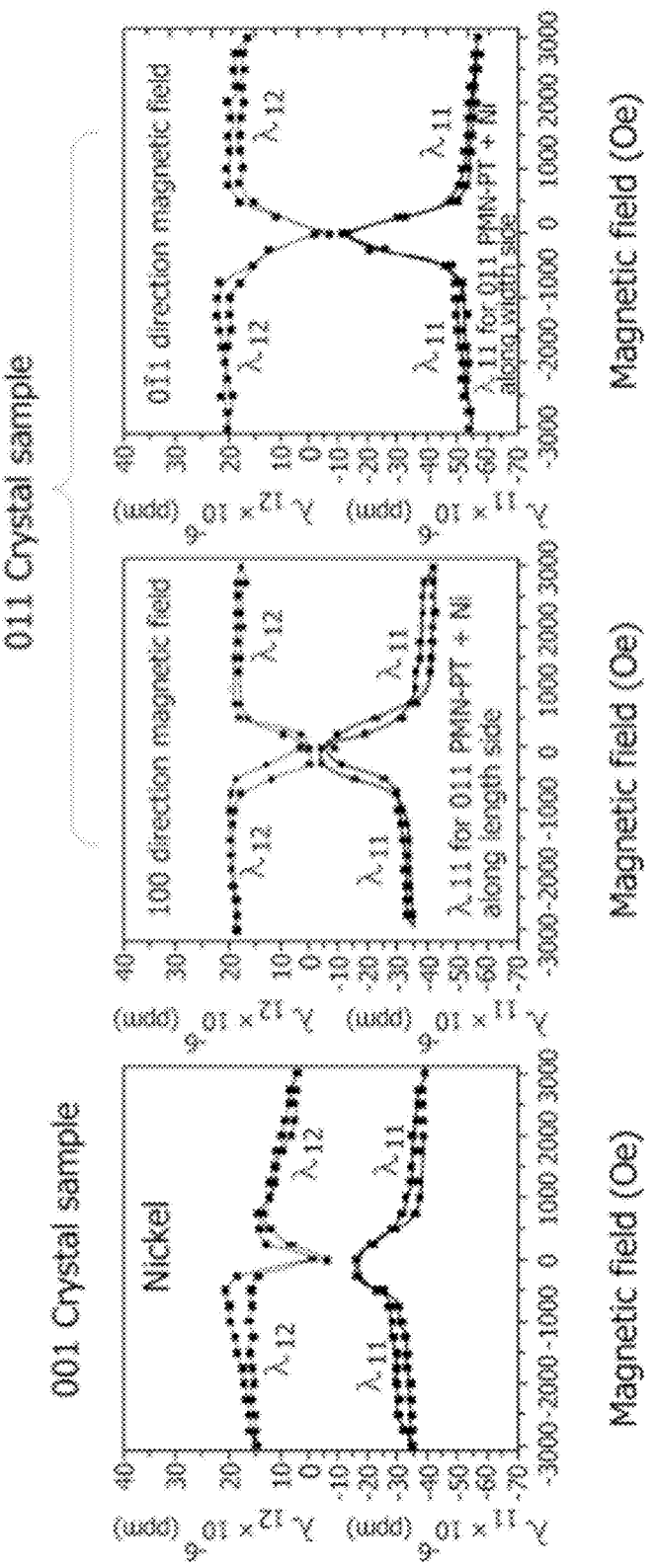
FIG. 9 illustrates changes in magnetostrictive properties depending on the amount of applied direct magnetic field, in the comparative example of FIG. 6 and the ME layered composite according to the present invention of FIG. 7.

FIG. 9 illustrates changes in magnetostrictive properties depending on the amount of applied direct magnetic field, in the comparative example of FIG. 6 and the ME layered composite of the invention of FIG. 7.

As illustrated in FIG. 9, there is no great change in magnetostrictive behavior of Ni of the ME layered composite depending on the orientation of the piezoelectric single crystals.

As such, $\lambda_{11}$ indicates the modification ($\lambda_\parallel$) in a direction parallel to the magnetic field, and $\lambda_{12}$ indicates the modification ($\lambda_\perp$) in a direction perpendicular to the magnetic field.

Figure 10:
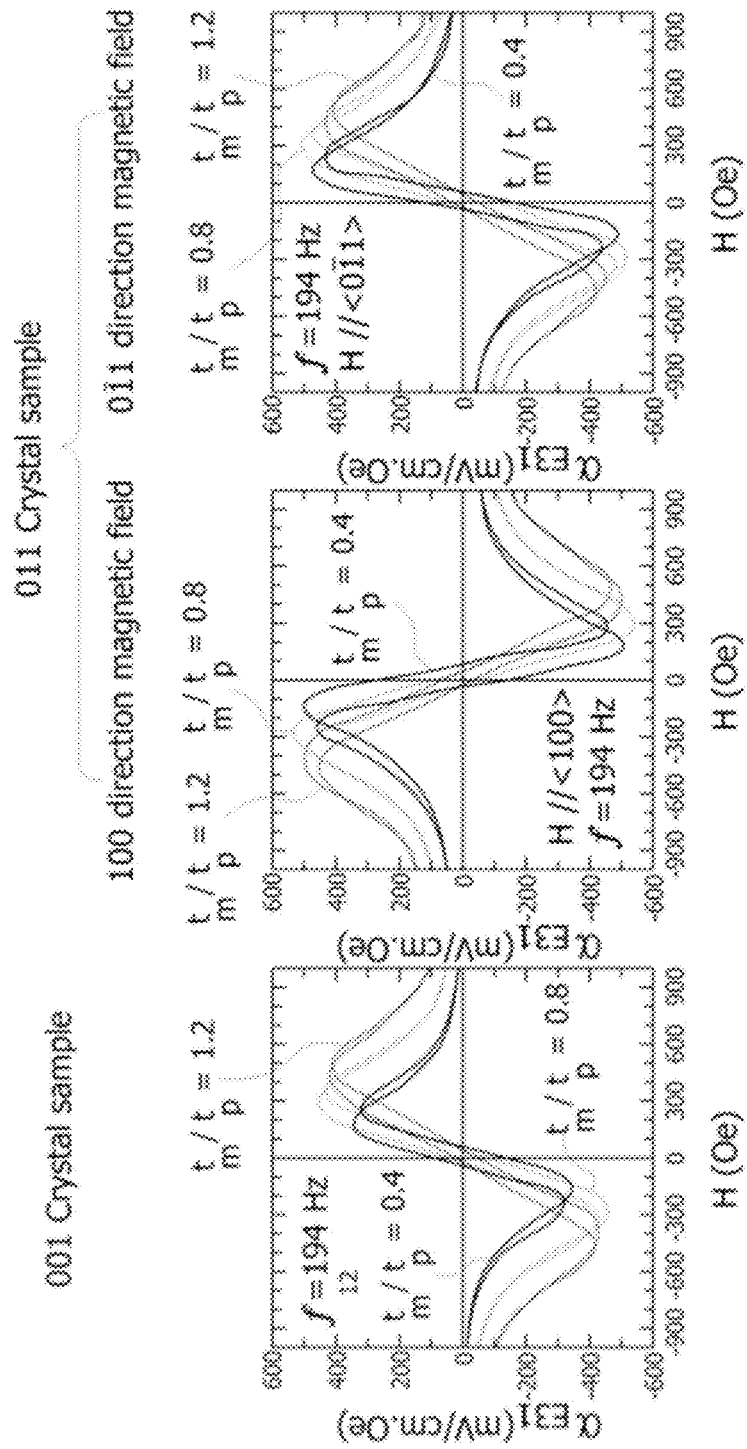
FIG. 10 illustrates changes in ME properties depending on the amount of applied direct magnetic field under conditions of an alternating magnetic field of low frequency (194 Hz) being applied at 1 Oe, in the comparative example of FIG. 6 and the ME layered composite according to the present invention of FIG. 7.

FIG. 10 illustrates changes in ME properties depending on the amount of applied direct magnetic field under conditions of an alternating magnetic field of low frequency (194 Hz) being applied at 1 Oe, in the comparative example of FIG. 6 and the ME layered composite of the invention of FIG. 7.

As illustrated in FIG. 10, when using the <011> oriented piezoelectric single crystals, higher ME properties may be obtained, compared to when using the <001> oriented piezoelectric single crystals. In particular, in terms of the magnetic field in the <0$\bar{1}$1> direction, the maximum ME coefficient ($\alpha_{ME}$) of the <011> oriented piezoelectric single crystals is approximately doubled, compared to the maximum ME coefficient ($\alpha_{ME}$) of the <001> oriented piezoelectric single crystals.

The thickness ratio of the Ni plate and the piezoelectric single crystal layer is preferably 0.4~2, and more preferably 1~2. As illustrated in FIG. 10, the ME properties may vary depending on the thickness ratio. When the thickness ratio is 1 or more, saturation occurs, and when the thickness ratio is 2 or more, material costs may increase, and the volume of the device may increase, undesirably lowering the device efficiency.

Figure 11:
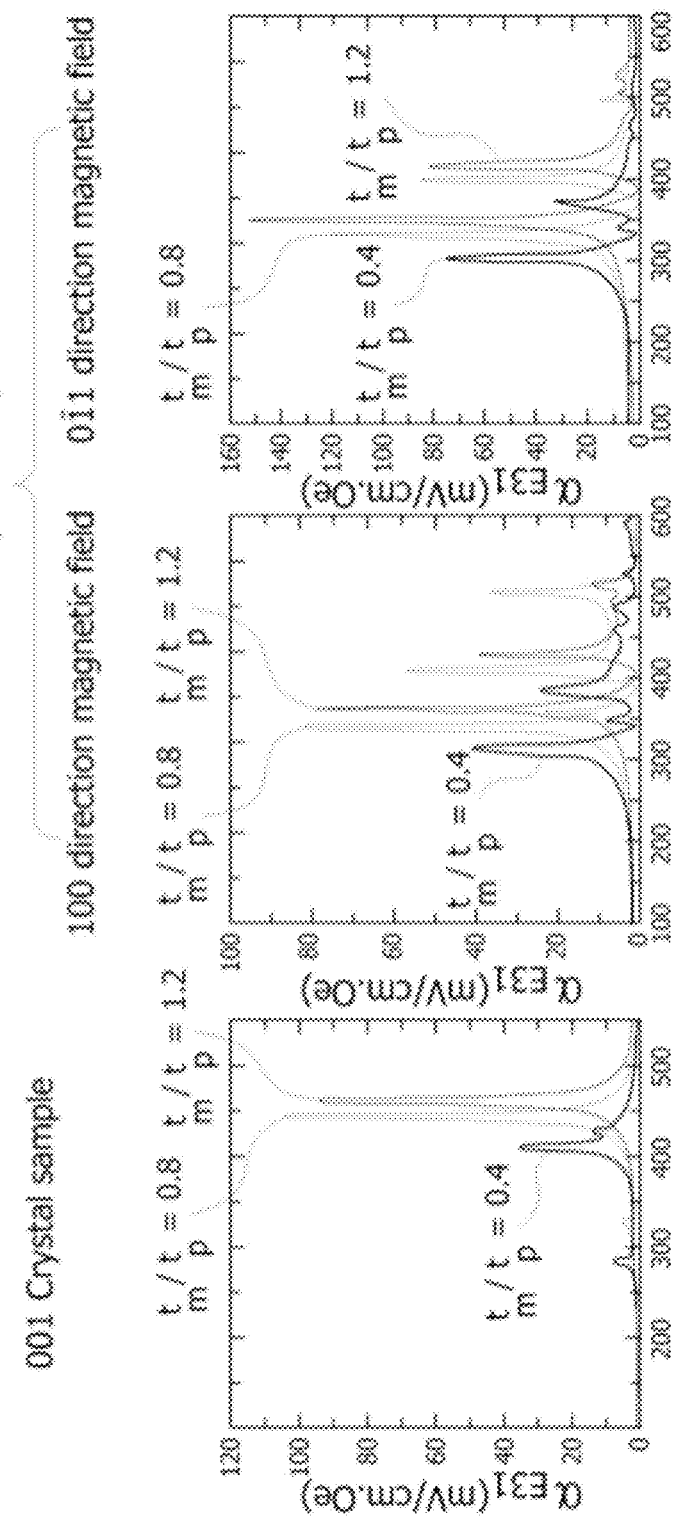
FIG. 11 illustrates changes in ME properties depending on changes in the frequency of the alternating magnetic field, in the comparative example of FIG. 6 and the ME layered composite according to the present invention of FIG. 7.

FIG. 11 illustrates changes in ME properties depending on changes in the frequency of the alternating magnetic field, in the comparative example of FIG. 6 and the ME layered composite of the invention of FIG. 7.

As illustrated in FIG. 11, although one resonance frequency appears when using the <001> oriented piezoelectric single crystals, three resonance frequencies are shown in the presence of the <011> oriented piezoelectric single crystals. When comparing the ME properties at these resonance frequencies, higher ME properties may be obtained when using the <011> oriented piezoelectric single crystals.

Figure 12:
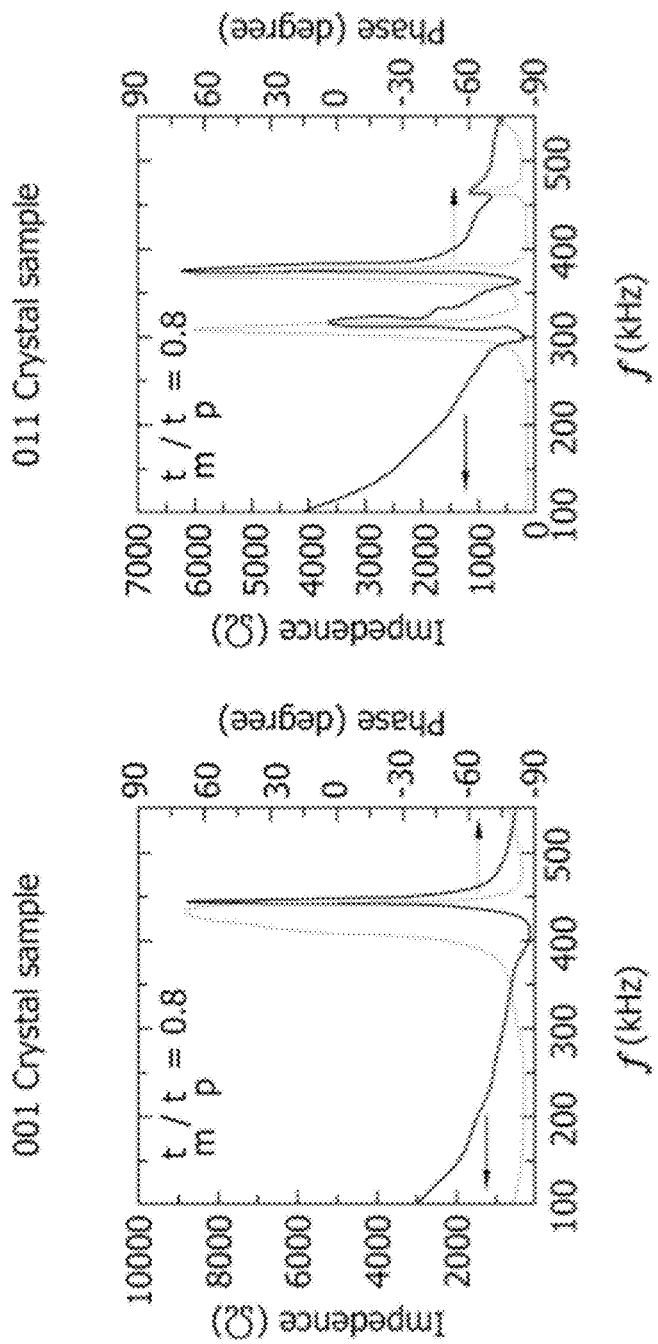
FIG. 12 illustrates changes in impedance properties depending on changes in the frequency of an electric field, in the comparative example of FIG. 6 and the ME layered composite according to the present invention of FIG. 7.

FIG. 12 illustrates changes in impedance properties depending on changes in the frequency of the electric field, in the comparative example of FIG. 6 and the ME layered composite of the invention of FIG. 7.

As illustrated in FIG. 12, although one resonance frequency appears when using the <001> oriented piezoelectric single crystals, three resonance frequencies are shown in the presence of the <011> oriented piezoelectric single crystals. When comparing with the frequency properties of FIG. 11, the ME properties become maximal at the antiresonance frequency of the structure.

As is apparent from the results of FIGS. 11 and 12, when the <011> oriented piezoelectric single crystals are stacked in a thickness direction of the layers, three resonance-antiresonance frequencies are shown depending on changes in the frequency of the applied magnetic field, and thus the impedance properties may vary depending on changes in the resonance-antiresonance frequencies.

Based on such properties, when the frequency of the alternating magnetic field applied to the magnetostrictive material layer is adjusted, the resonance frequency of the composite becomes variable, and electrical properties thereof may also vary, and thus this composite may be employed in electronic devices requiring changes in impedance, as necessary. In particular, because the ME properties become maximal at the antiresonance frequency, the ratio between thickness, width and length of the composite is adjusted, so that the resonance-antiresonance frequency range may also be controlled, making it possible to manufacturing a device having maximum ME properties at a specific frequency.

Figure 13:
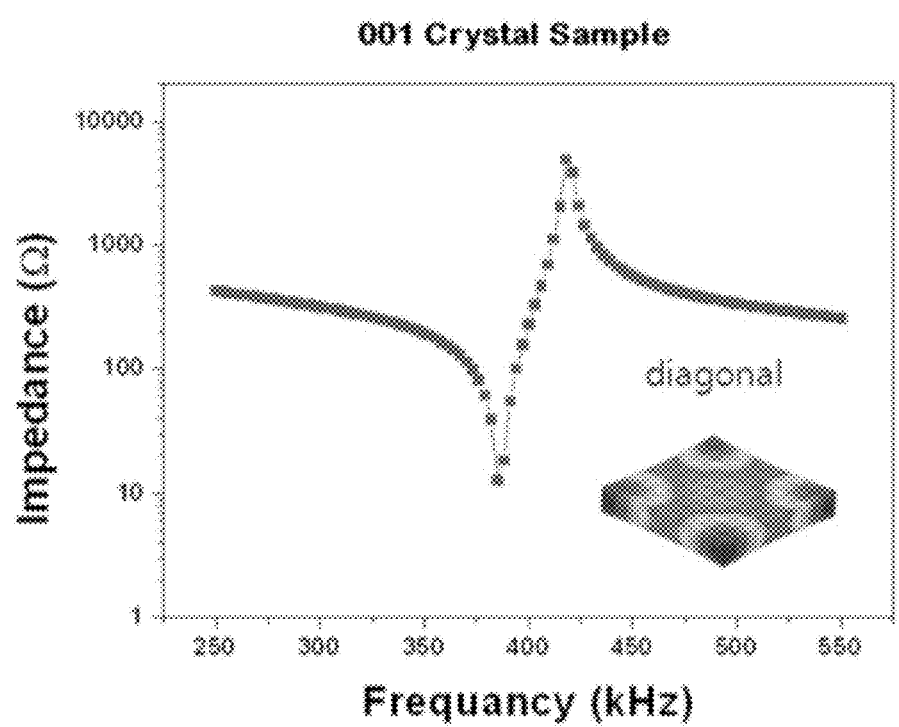
FIG. 13 illustrates the results of finite element analysis of the resonance mode of the comparative example of FIG. 6 using commercially available ATILA software.
Figure 14:
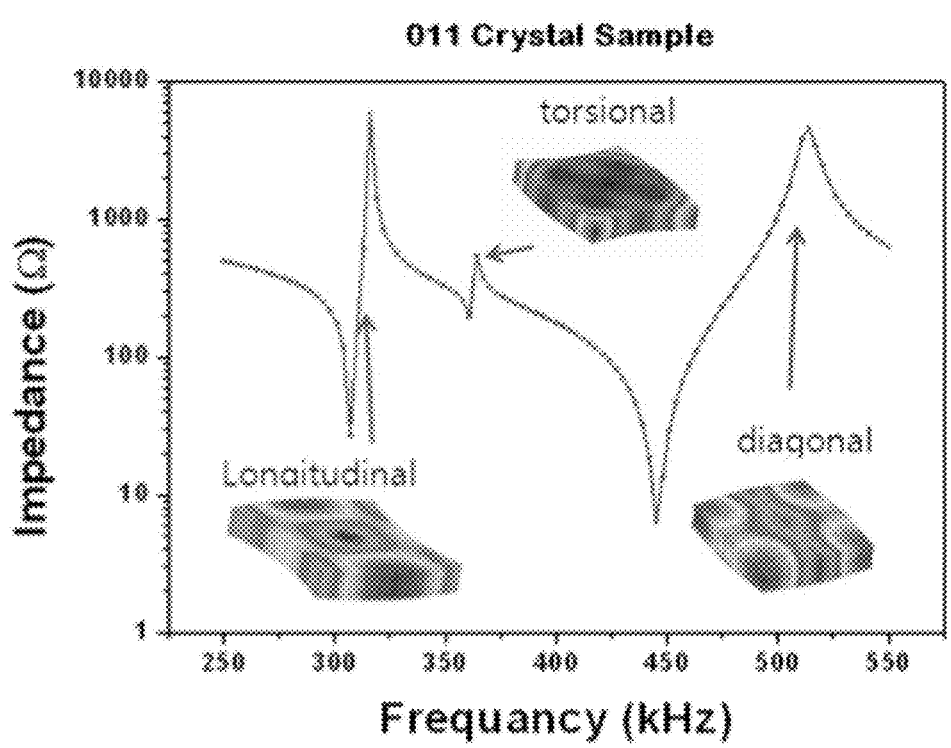
FIG. 14 illustrates the results of finite element analysis of the resonance mode of the ME layered composite according to the present invention of FIG. 7 using commercially available ATILA software.

FIG. 13 illustrates the results of finite element analysis of the resonance mode of the comparative example of FIG. 6 using commercially available ATILA software, and FIG. 14 illustrates the results of finite element analysis of the resonance mode of the ME layered composite according to the present invention of FIG. 7 using commercially available ATILA software.

The resonance mode of the <001> oriented piezoelectric single crystals of FIG. 13 is confirmed to have one resonance mode in the measured frequency range, which is very similar to actual measurements. In this case, the vibration mode is confirmed to be a diagonal vibration mode in which expansion and contraction occur at respective corner directions.

Also, the resonance mode of the <011> oriented piezoelectric single crystals of FIG. 14 is confirmed to have three resonance modes in the measured frequency range, which is the same as in actual tests but is slightly different from actual measurements. This difference is considered to be because the piezoelectric constant of the piezoelectric single crystal material used in the tests is different from the piezoelectric constant used in computer simulation and to be due to the thickness of an adhesive.

The ME layered composite of the invention of FIG. 7 is merely illustrative, and a plurality of layered structures having various piezoelectric and magnetostrictive materials, which will be described later, may be applied.

At least one piezoelectric material layer composed of a piezoelectric material and at least one magnetostrictive material layer composed of a magnetostrictive material may be stacked. As such, when the piezoelectric material layer is configured such that <011> oriented single crystals are stacked in a thickness direction, the maximum ME coefficient ($\alpha_{ME}$) may increase, thus improving sensitivity, compared to the conventional <011> oriented single crystals.

The piezoelectric material layer and the magnetostrictive material layer are alternately stacked, and the thickness ratio of the piezoelectric material layer and the magnetostrictive material layer is set to 0.4~2 so as to attain superior ME properties. In particular, when this thickness ratio is 1~2, efficiency and profitability are good.

Figure 15:
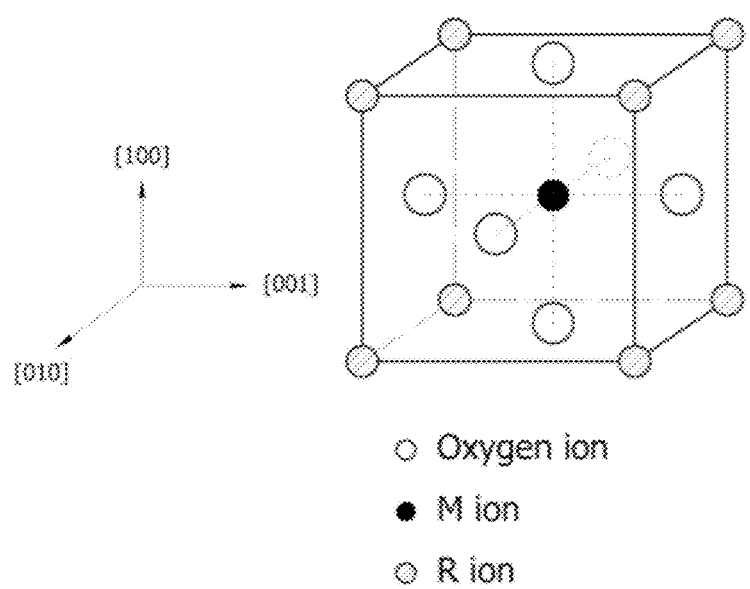
FIG. 15 illustrates a schematic perspective view of a perovskite crystal structure ($RMO_3$)

The crystal structure of the single crystals is preferably a perovskite structure, and FIG. 15 is a schematic perspective view of the perovskite crystal structure ($RMO_3$).

The perovskite structure refers to a structure ($RMO_3$) in which, in the unit lattice of a solid-solution single crystal illustrated in FIG. 15, R ions are positioned at the corners of the unit lattice, oxygen ions are positioned at the face centers of the unit lattice, and an M ion is positioned at the body center of the unit lattice.

The single crystals used in the piezoelectric material layer according to the present invention may be a solid solution having a complex perovskite structure, comprising $xPb(A1, A2, \ldots, B1, B2, \ldots)O_3 + (1-x)PbTiO_3$ (wherein x is a molar fraction, $0<x<1$), in which A1, A2, ... are any one or a plurality of elements selected from the group consisting of Zn, Mg, Ni, Lu, In and Sc, and B1, B2, ... are any one or a plurality of elements selected from the group consisting of Nb, Ta, Mo and W. The case where the single crystals having such a complex perovskite structure are used makes it possible to manufacture a device adapted for a transverse vibration mode.

That is, as illustrated in FIG. 15, the unit lattice of the solid-solution single crystal is a perovskite structure ($RMO_3$) in which Pb ions are positioned at corners of the unit lattice, and oxygen ions are positioned at the face centers of the unit lattice, and the M ion is positioned at the body center of the unit lattice. Furthermore, the M ion positioned at the body center of FIG. 15 is not limited to one kind of element ion, but may be any one among any one or a plurality of elements selected from the group consisting of Zn, Mg, Ni, Lu, In and Sc and any one or a plurality of elements selected from the group consisting of Nb, Ta, Mo and W.

More specifically, the single crystals of the piezoelectric material layer may be any one selected from among $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), and $BaTiO_3$.

As such, the solid-solution single crystal of zinc lead niobate-lead titanate (PZN-PT or PZNT) is configured such that, as illustrated in FIG. 15, the unit lattice thereof is a complex perovskite structure (including Pb ions at corners of the unit lattice, and any one element ion of Zn, Nb and Ti at the body center of the unit lattice).

However, the piezoelectric material layer is not limited to such an illustrative structure, and any one may be used so long as it is conventional piezoelectric single crystals.

Also, the magnetostrictive material of the magnetostrictive material layer may include any one selected from among ferrite-based ceramics such as $CoFe_2O_4$ and $NiFe_2O_4$, Ni, Terfenol, Gafenol, Fe, and Metglas.

There are exemplified by a spinel or magnetoplumbite type ferrite represented by $MFe_2O_4$ or $MFe_{12}O_{19}$ (wherein M is at least one divalent metal ion), a ferrite represented by $M'_3Fe_5O_{12}$ (wherein M' is a trivalent metal ion), and lithium ferrite represented by $Li_{0.5}Fe_{2.5}O_4$, and these magnetic materials have superior magnetic properties and thus may be adopted as the magnetostrictive material of the invention.

More specifically, for example, soft ferrite such as $Fe_3O_4$, $NiFe_2O_4$, $MnFe_2O_4$, $(Ni,Zn)Fe_2O_4$, $(Mn,Zn)Fe_2O_4$, $CoFe_2O_4$, etc, is a soft magnetic material requiring high permeability, low coercive force and low loss, and may be utilized in the cores of inductors, transducers and filters; magnetic head cores, magnetic shielding materials, etc., and may also be used as a magnetostrictive material. Hence, such soft ferrite may be applied in the present invention.

$\gamma$-$Fe_2O_3$ and barium ferrite having high crystal magnetic anisotropy are used as a permanent magnetic material and a high-density magnetic recording material, and may also be used as the magnetostrictive material of the invention. A rare earth alloy $Tb_{0.3}Dy_{0.7}Fe$ is recently receiving attention as the magnetostrictive material (Jounal of Alloys and Compounds, vol. 258, 1997), and is commercialized (trade name: Terfenol-D). The maximum magnetostrictive amount of Terfenol-D is 0.17%.

Examples of the magnetostrictive material may include, but are not limited to, magnetostrictive alloys, such as a terbium-dysprosium-iron alloy (Terfenol-D), a gallium-iron alloy (Gafenol), a samarium-dysprosium-iron alloy (Samfenol-D), a boron-silicon-iron alloy (Metglas 2605SA1), a boron-silicon-carbon-iron alloy (Metglas 2605SC), etc.

The materials used in the magnetostrictive and piezoelectric material layers may include the above-listed various materials per layer, which are the same as or different from each other.

Furthermore, the magnetostrictive and piezoelectric material layers may be stacked. As illustrated in FIG. 7, a first magnetostrictive material layer composed of a magnetostrictive material is positioned uppermost, the piezoelectric material layer composed of a piezoelectric material is positioned thereunder, and a second magnetostrictive material layer composed of a magnetostrictive material is positioned thereunder, wherein the piezoelectric material layer is configured so that the <011> oriented single crystals are stacked in a thickness direction of the layers.

The ME composite according to the present invention with an ME effect includes at least one piezoelectric material layer composed of a piezoelectric material and at least one magnetostrictive material layer composed of a magnetostrictive material, wherein the piezoelectric material layer is configured such that the <011> oriented single crystals are stacked in a thickness direction, and this composite may be applied to a variety of electronic devices including condensers.

Because the ME composite according to the present invention exhibits an ME effect, it is manufactured into a condenser and thereby utilized in a variety of electronic devices, including spintronic devices, ultrahigh-speed information storage devices, magnetic-electric sensors, magnetic sensors, electric sensors, optoelectronic devices, microwave electronic devices, transducers, magnetic driving energy harvesters, magnetic-mechanical composite energy harvesters, etc.

Based on the maximum ME properties of the ME composite according to the present invention at the antiresonance frequency depending on the frequency of the alternating magnetic field, the dimension ratio of the composite may be adjusted, so that the resonance-antiresonance frequency range may be controlled, making it possible to manufacture a device having maximum ME properties at a specific frequency.

Figure 16:
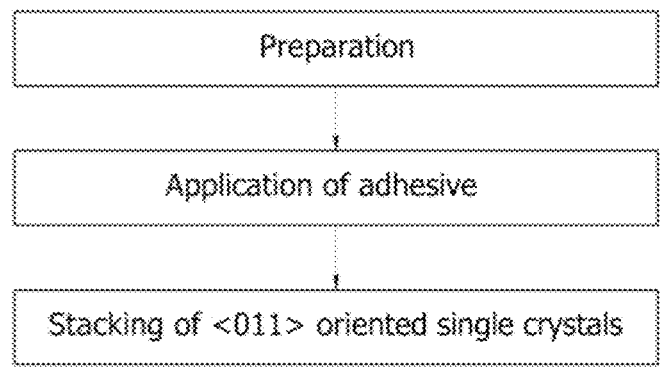
FIG. 16 illustrates a flowchart of a process of manufacturing the ME composite according to the present invention.

FIG. 16 illustrates a flowchart of a process of manufacturing the ME composite according to the present invention.

As illustrated in FIG. 16, the method includes preparing at least one piezoelectric material layer composed of a piezoelectric material and at least one magnetostrictive material layer composed of a magnetostrictive material (S100), and alternately stacking the piezoelectric material layer and the magnetostrictive material layer so that single crystals are <011> oriented, wherein the piezoelectric material layer is configured such that the <011> oriented single crystals are stacked in a thickness direction.

The method may further include, after S100, applying a conductive epoxy adhesive onto a surface for bonding the piezoelectric material layer and the magnetostrictive material layer to each other (S150), thus completing the ME composite.

As described hereinbefore, the present invention provides an ME composite. According to the present invention, in the ME composite made up of both a piezoelectric material and a magnetostrictive material, an example of the piezoelectric material can include a piezoelectric single crystal material having high piezoelectric properties, and an example of the magnetostrictive material can include a metal magnetostrictive material having high magnetostrictive properties, thus achieving an ME composite having a layered structure via adhesion. As such, the composite is manufactured such that a <011> crystal orientation of the piezoelectric single crystal material is set to a thickness direction, thus obtaining a high ME voltage coefficient which is at least doubled compared to a conventional <001> crystal orientation, and ensuring a maximum ME voltage coefficient at an electric-mechanical antiresonance frequency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A magnetoelectric composite, comprising at least one piezoelectric material layer composed of a piezoelectric material and at least one magnetostrictive material layer composed of a magnetostrictive material, which are stacked, wherein the piezoelectric material layer is configured such that <011> oriented single crystals are stacked in a thickness direction with <100> direction and <0$\bar{1}$1> direction of the single crystals being longitudinal direction and width direction, respectively wherein the magnetoelectric composite has multiple longitudinal and width direction in-plane resonance vibration mode corresponding to longitudinal, torsional and diagonal resonance mode.

2. The magnetoelectric composite of claim 1, wherein a crystal structure of the single crystals is a perovskite structure.

3. The magnetoelectric composite of claim 1, wherein the single crystals are a solid solution comprising xPb (A, B)O3+ (1−x)PbTiO3 (wherein x is a molar fraction, 0<x<1), in which A is any one or a plurality of elements selected from the group consisting of Zn, Mg, Ni, Lu, In and Sc, and B is any one or a plurality of elements selected from the group consisting of Nb, Ta, Mo and W.

4. The magnetoelectric composite of claim 1, wherein the single crystals are any one selected from among Pb $(Mg_{1/3}Nb_{2/3})O_3$—$PbTiO_3$ (PMN-PT), Pb $(Zn_{1/3}Nb_{2/3})O_3$—$PbTiO_3$ (PZN-PT), and $BaTiO_3$.

5. The magnetoelectric composite of claim 1, wherein the magnetostrictive material is any one selected from among ferrite-based ceramics, Ni, Terfenol, Gafenol, Fe and Metglas.

6. The magnetoelectric composite of claim 1, wherein the magnetostrictive material layer and the piezoelectric material layer are alternately stacked.

7. The magnetoelectric composite of claim 1, wherein a ratio between thickness, width and length of the magnetoelectric composite is adjusted, so that a resonance-antiresonance frequency range of the magnetoelectric composite becomes variable.

8. The magnetoelectric composite of claim 1, wherein a thickness ratio of the piezoelectric material layer and the magnetostrictive material layer is 0.4~2.

9. A magnetoelectric composite, comprising:
a first magnetostrictive material layer composed of a magnetostrictive material;
a piezoelectric material layer composed of a piezoelectric material; and
a second magnetostrictive material layer composed of a magnetostrictive material,
wherein the piezoelectric material layer is configured such that <011> oriented single crystals are stacked in a thickness direction with <100> direction and <0$\bar{1}$1> direction of the single crystals being longitudinal direction and width direction, respectively wherein the magnetoelectric composite has multiple longitudinal and width direction in-plane resonance vibration mode corresponding to longitudinal, torsional and diagonal resonance mode.

10. The magnetoelectric composite of claim 9, wherein a crystal structure of the single crystals is a perovskite structure.

11. The magnetoelectric composite of claim 9, wherein the single crystals are a solid solution comprising xPb (A, B)O3+ (1−x)PbTiO3 (wherein x is a molar fraction, 0<x<1), in which A is any one or a plurality of elements selected from the group consisting of Zn, Mg, Ni, Lu, In and Sc, and B is any one or a plurality of elements selected from the group consisting of Nb, Ta, Mo and W.

12. The magnetoelectric composite of claim 9, wherein the single crystals are any one selected from among Pb $(Mg_{1/3}Nb_{2/3})O_3$—$PbTiO_3$ (PMN-PT), Pb $(Zn_{1/3}Nb_{2/3})O_3$—$PbTiO_3$ (PZN-PT), and $BaTiO_3$.

13. The magnetoelectric composite of claim 9, wherein the magnetostrictive material is any one selected from among ferrite-based ceramics, Ni, Terfenol, Gafenol, Fe and Metglas.

14. The magnetoelectric composite of claim 9, wherein a thickness ratio of the piezoelectric material layer and the first or second magnetostrictive material layer is 0.4~2.

15. The magnetoelectric composite of claim 9, wherein a ratio between thickness, width and length of the magnetoelectric composite is adjusted, so that a resonance-antiresonance frequency range of the magnetoelectric composite becomes variable.

16. An electronic device, which comprises a magnetoelectric composite having a magnetoelectric effect and comprising at least one piezoelectric material layer composed of a piezoelectric material and at least one magnetostrictive material layer composed of a magnetostrictive material, which are stacked and in which the piezoelectric material layer is configured such that <011> oriented single crystals are stacked in a thickness direction with <100> direction and <0$\bar{1}$1> direction of the single crystals being longitudinal direction and width direction, respectively wherein the magnetoelectric composite has multiple longitudinal and width direction in-plane resonance vibration mode corresponding to longitudinal, torsional and diagonal resonance mode.

17. The electronic device of claim 16, wherein the electronic device is any one selected from among a spintronic device, an ultrahigh-speed information storage device, a magnetic-electric sensor, a magnetic sensor, an electric sensor, an optoelectronic device, a microwave electronic device, a magnetic-electric transducer, an electric-magnetic transducer, a magnetic driving energy harvester, and a magnetic-mechanical composite energy harvester.

18. The electronic device of claim 17, wherein the electronic device utilizes the magnetoelectric effect.

19. The electronic device of claim 18, wherein a ratio between thickness, width and length of the magnetoelectric composite is adjusted, so that a resonance-antiresonance frequency range of the magnetoelectric composite becomes variable.

20. A method of manufacturing a magnetoelectric composite, comprising:
preparing at least one piezoelectric material layer composed of a piezoelectric material and at least one magnetostrictive material layer composed of a magnetostrictive material; and
alternately stacking the piezoelectric material layer and the magnetostrictive material layer, wherein the piezoelectric material layer is configured such that <011> oriented single crystals are stacked in a thickness direction with <100> direction and <0$\bar{1}$1> direction of the single crystals being longitudinal direction and width direction, respectively wherein the magnetoelectric composite has multiple longitudinal and width direction in-plane resonance vibration mode corresponding to longitudinal, torsional and diagonal resonance mode.

21. The method of claim 20, further comprising applying a conductive epoxy adhesive onto a surface for bonding the piezoelectric material layer and the magnetostrictive material layer to each other, after preparing.

* * * * *